(12) United States Patent
Han et al.

(10) Patent No.: US 11,287,704 B2
(45) Date of Patent: Mar. 29, 2022

(54) DISPLAY DEVICE

(71) Applicant: Samsung Display Co., Ltd., Yongin-Si (KR)

(72) Inventors: Duyeon Han, Seongnam-si (KR); Ji hyun Kim, Yongin-si (KR); Seung-Won Kuk, Theonan-si (KR); Jin-Mo Kwon, Incheon (KR); Minhyoung Kim, Daegu (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/076,868

(22) Filed: Oct. 22, 2020

(65) Prior Publication Data

US 2021/0124204 A1    Apr. 29, 2021

(30) Foreign Application Priority Data

Oct. 23, 2019    (KR) .................. 10-2019-0131825

(51) Int. Cl.
*H05K 1/00* (2006.01)
*G02F 1/1345* (2006.01)
*H05K 1/18* (2006.01)
*H01L 23/498* (2006.01)

(52) U.S. Cl.
CPC ...... *G02F 1/13452* (2013.01); *G02F 1/13458* (2013.01); *H05K 1/189* (2013.01); *H01L 23/4985* (2013.01); *H05K 2201/10136* (2013.01)

(58) Field of Classification Search
CPC . G02F 1/13452; G02F 1/13458; H05K 1/189; H05K 2201/10136; H01L 23/4985

USPC ......................................................... 361/749
See application file for complete search history.

(56) References Cited

U.S. PATENT DOCUMENTS

| | | | |
|---|---|---|---|
| 9,299,951 B2 | 3/2016 | Kim et al. | |
| 10,324,343 B2 | 6/2019 | Son et al. | |
| 2007/0164948 A1 | 7/2007 | Kim et al. | |
| 2016/0335973 A1* | 11/2016 | Chung | .................. H01L 27/124 |
| 2017/0194412 A1* | 7/2017 | Park | .................... H01L 27/3248 |

FOREIGN PATENT DOCUMENTS

| | | |
|---|---|---|
| KR | 10-2007-0075583 A | 7/2007 |
| KR | 10-2015-0047711 A | 5/2015 |
| KR | 10-2018-0028097 A | 3/2018 |

* cited by examiner

*Primary Examiner* — Andargie M Aychillhum
(74) *Attorney, Agent, or Firm* — Innovation Counsel LLP

(57) ABSTRACT

Disclosed is a display device comprising a display panel which includes a display area and a non-display area surrounding the display area, the display panel including a plurality of driving lines disposed on the non-display area, and a plurality of driving pads connected to the plurality of driving lines, a plurality of side electrodes disposed on a side surface of the display panel and in contact with side surfaces of the plurality of driving pads, and a flexible film that includes a plurality of lead electrodes in contact with the plurality of side electrodes. The plurality of driving pads includes first to third driving pads that are sequentially arranged in a first direction. A first interval between the first and second driving pads is different from a second interval between the second and third driving pads.

18 Claims, 15 Drawing Sheets

DISPLAY DEVICE

CROSS-REFERENCE TO RELATED APPLICATION

This U.S. nonprovisional application claims priority under 35 U.S.C § 119 to Korean Patent Application No. 10-2019-0131825 filed on Oct. 23, 2019, in the Korean Intellectual Property Office, the disclosures of which are hereby incorporated by reference in their entirety.

BACKGROUND

The present inventive concept relates to a display device, and more particularly, to a display device with improved bonding reliability.

A display device generally comprises a display panel that includes a plurality of pixels and a driver chip that drives the pixels. The driver chip is disposed on a flexible film, and the flexible film is connected to the display panel. The driver chip is connected through the flexible film to the pixels of the display panel. This type connection is defined as a chip-on-film method.

The flexible film is provided thereon with a plurality of leads connected to the driver chip, and the display panel includes a plurality of pads connected to the pixels. The leads are connected to corresponding pads on the display panel, and thus the driver chip is connected to the pixels.

The pads and the leads are connected in various manners. For example, the pads and the leads may be electrically connected to each other through anisotropic conductive films. Alternatively, the pads and the leads may be connected to each other in an ultrasonic bonding manner without anisotropic conductive films.

There has recently been studied a structure where the flexible film is disposed on a side surface of the display panel so as to decrease a bezel width of the display device and to increase a display area on which an image is displayed.

SUMMARY

Some example embodiments of the present inventive concept provide a display device with improved bonding reliability.

According to some example embodiments of the present inventive concept, a display device may comprise: a display panel which includes a display area and a non-display area surrounding the display area, the display panel including a plurality of driving lines disposed in the non-display area, and a plurality of driving pads connected to the plurality of driving lines; a plurality of side electrodes disposed in a side surface of the display panel and in contact with side surfaces of the plurality of driving pads; and a flexible film that includes a plurality of lead electrodes in contact with the plurality of side electrodes. The plurality of driving pads may include first to third driving pads that are sequentially arranged in a first direction. A first interval between the first and second driving pads may be different from a second interval between the second and third driving pads.

In some embodiments of the present inventive concept, the first driving pad may receive a first control signal having a first potential. The second driving pad may receive a second control signal having a second potential. The third driving pad may receive a third control signal having a third potential. A potential difference between the first and second control signals may be different from a potential difference between the second and third control signals.

In some embodiments of the present inventive concept, the potential difference between the first and second control signals may be less than a preset reference value. The first and second driving pads may be spaced apart at the first interval. The potential difference between the second and third control signals may be greater than the reference value. The second and third driving pads may be spaced apart at the second interval greater than the first interval.

In some embodiments of the present inventive concept, the reference value may be equal to or greater than about 7 V.

In some embodiments of the present inventive concept, the first interval may be less than about 140 µm. The second interval may be equal to or greater than about 140 µm.

In some embodiments of the present inventive concept, the plurality of side electrodes may include: a first side electrode in contact with a side surface of the first driving pad; a second side electrode in contact with a side surface of the second driving pad; and a third side electrode in contact with a side surface of the third driving pad. The first and second side electrodes may be spaced apart at the first interval. The second and third side electrodes may be spaced apart at the second interval greater than the first interval.

In some embodiments of the present inventive concept, the plurality of side electrodes may include silver (Ag). The plurality of driving pads may include copper (Cu).

In some embodiments of the present inventive concept, the display device may further comprise a driver chip mounted on the flexible film. The plurality of driving lines may have electrical connection with the driver chip and may supply control signals required to drive the driver chip.

In some embodiments of the present inventive concept, the display panel may include: a pixel on the display area; a data line connected to the pixel; and a gate line connected to the pixel. The driver chip may include: a data driver chip that outputs a data signal provided to the data line; and a gate driver chip that outputs a gate signal provided to the gate line.

In some embodiments of the present inventive concept, the plurality of driving lines may provide the gate driver chip with a control signal required to drive the gate driver chip.

In some embodiments of the present inventive concept, the display device may further comprise an anisotropic conductive film disposed between the flexible film and the plurality of side electrodes. Each of the plurality of side electrodes may be electrically connected through the anisotropic conductive film to a corresponding one of the plurality of lead electrodes.

In some embodiments of the present inventive concept, each of the plurality of side electrodes may be directly bonded to a corresponding one of the plurality of lead electrodes.

According to some example embodiments of the present inventive concept, a display device may comprise: a display panel which includes a display area and a non-display area surrounding the display area, the display panel including a plurality of driving lines disposed in the non-display area, a plurality of driving pads connected to the plurality of driving lines, and a floating pad disposed between adjacent driving pads, the floating pad being in a floating state; a plurality of side electrodes on a side surface of the display panel and in contact with side surfaces of the plurality of driving pads; and a flexible film that includes a plurality of lead electrodes in contact with the plurality of side electrodes.

In some embodiments of the present inventive concept, the plurality of driving pads may include first to third driving pads that are sequentially arranged in a first direction. The first driving pad may receive a first control signal having a first potential. The second driving pad may receive a second control signal having a second potential. The third driving pad may receive a third control signal having a third potential. A potential difference between the first control signal and the second control signal may be different from a potential difference between the second control signal and the third control signal.

In some embodiments of the present inventive concept, the potential difference between the first control signal and the second control signal may be less than a reference value. The floating pad may not be disposed between the first and second driving pads. The potential difference between the second control signal and the third control signal may be greater than the reference value. The floating pad may be disposed between the second and third driving pads.

In some embodiments of the present inventive concept, the reference value may be equal to or greater than about 7 V.

In some embodiments of the present inventive concept, the first and second driving pads may be spaced apart at a first interval. The second and third driving pads may be spaced apart at a second interval greater than the first interval.

In some embodiments of the present inventive concept, the plurality of side electrodes may include: a first side electrode in contact with a side surface of the first driving pad; a second side electrode in contact with a side surface of the second driving pad; and a third side electrode in contact with a side surface of the third driving pad. The first and second side electrodes may be spaced apart at the first interval. The second and third side electrodes may be spaced apart at the second interval greater than the first interval.

In some embodiments of the present inventive concept, the plurality of side electrodes may include silver (Ag). The plurality of driving pads may include copper (Cu).

In some embodiments of the present inventive concept, the display device may further comprise an anisotropic conductive film disposed between the flexible film and the plurality of side electrodes. Each of the plurality of side electrodes may be electrically connected through the anisotropic conductive film to a corresponding one of the plurality of lead electrodes.

DETAILED DESCRIPTION OF EMBODIMENTS

Figure 1:
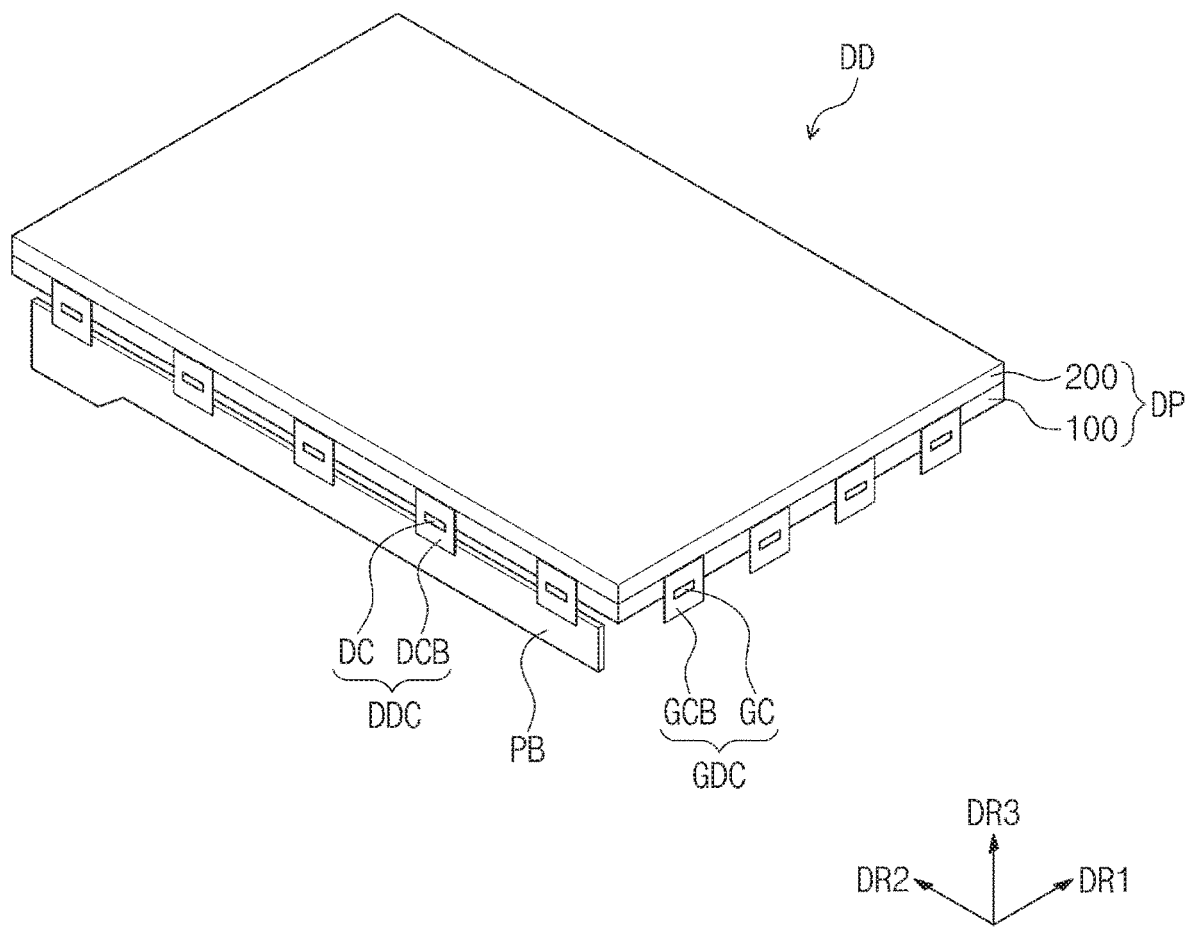
FIG. 1 illustrates a perspective view showing a display device according to some example embodiments of the present inventive concept.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present inventive concept. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe some example embodiments of the present inventive concept in conjunction with the accompanying drawings.

Figure 2:
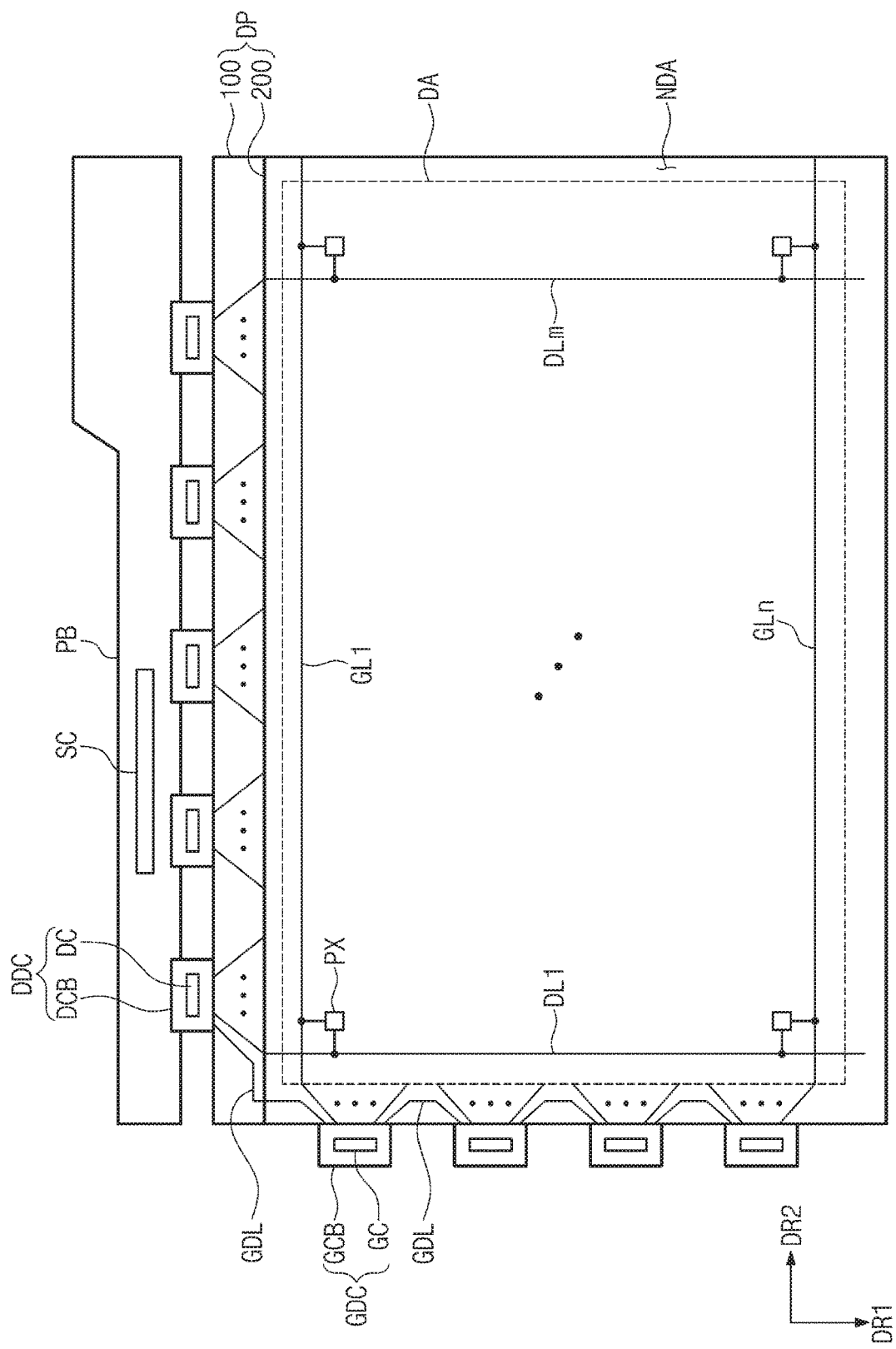
FIG. 2 illustrates a plan view showing a display device according to some example embodiments of the present inventive concept.
Figure 3:
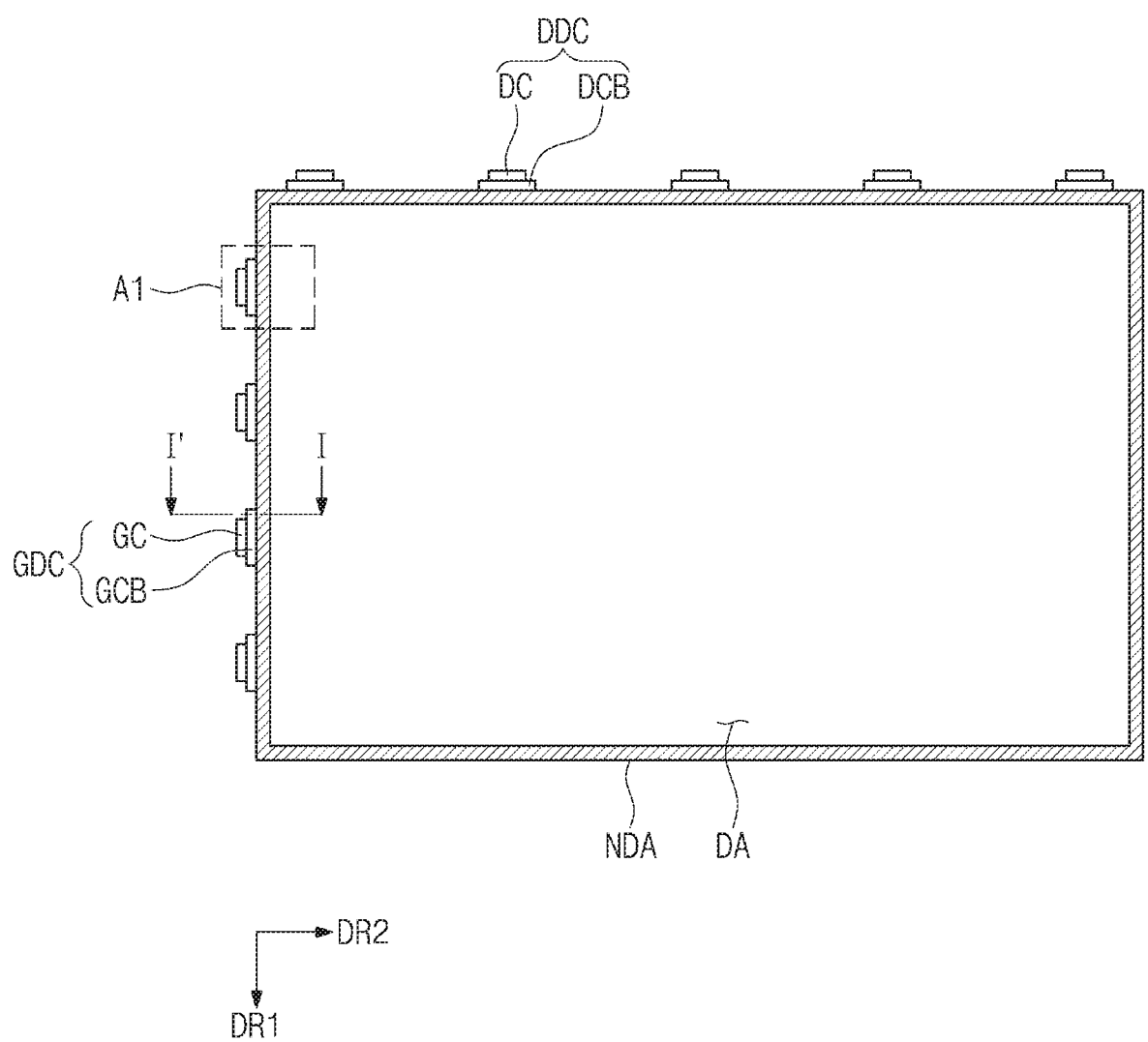
FIG. 3 illustrates a plan view showing a display panel according to some example embodiments of the present inventive concept.

FIG. 1 illustrates a perspective view showing a display device according to some example embodiments of the present inventive concept. FIG. 2 illustrates a plan view showing a display device according to some example embodiments of the present inventive concept. FIG. 3 illustrates a plan view showing a display panel according to some example embodiments of the present inventive concept.

Referring to FIGS. 1 and 2, a display device DD includes a display panel DP, a main circuit board PB, a gate driver GDC, a data driver DDC, and a signal controller SC.

According to an example embodiment, the display device DD may be applicable to medium and large-sized electronic products such as laptop computers and television sets and also to small-sized electronic products such as mobile phones, tablet computers, game consoles, and smart watches.

According to an example embodiment, the display panel DP may be provided as one of an organic light emitting display panel, a liquid crystal display panel, a plasma display panel, an electrophoretic display panel, a microelectromechanical system (MEMS) display panel, and an electrowetting display panel.

The display panel DP may include a first substrate 100 and a second substrate 200 disposed on the first substrate 100. The first substrate 100 and the second substrate 200 may be provided as a glass substrate or a plastic substrate.

For example, when the display panel DP is a liquid crystal display panel, a liquid crystal layer may be disposed between the first substrate 100 and the second substrate 200. For another example, when the display panel DP is an organic field light emitting display panel, the first substrate 100 may be provided thereon with a circuit layer including light-emitting unit elements. In this case, the second substrate 200 may be an encapsulation substrate or an encapsulation layer. For another example, the display panel DP may be an input sensing unit that detects an external input. The external input may mean, for example, a touch input.

The display panel DP may be in parallel to a plane defined by a first direction DR1 and a second direction DR2. A third direction DR3 indicates a normal direction to the display panel DP. The third direction DR3 denotes a thickness direction of the display device DD. The third direction DR3 differentiates a front surface and a rear surface of each member. However, directions indicated by the first, second, and third directions DR1, DR2, and DR3 are relative concepts, and may be changed into other directions.

Referring to FIGS. 2 and 3, the display panel DP may include a display area DA and a non-display area NDA. The display area DA may be a region where an image is displayed, and the non-display area NDA may be a region where no image is displayed. The non-display area NDA may be a region in which a light-shielding material such as a black matrix is formed and from which light is not emitted externally. The non-display area NDA is formed on an edge of the display panel DP, while surrounding the display area DA. A plurality of pixels PX may be disposed on the display area DA.

As an embodiment of the present inventive concept, the display panel DP has a tetragonal shape in a plan view. In addition, the first and second substrates 100 and 200 may be combined to align their edges with each other on each of four sides of the display panel DP.

The first substrate 100 includes a plurality of gate lines GL1 to GLn and a plurality of data lines DL1 to DLm that intersect the gate lines GL1 to GLn. In addition, the first substrate 100 includes a plurality of pixels PX connected to the gate lines GL1 to GLn and the data lines DL1 to DLm. The gate lines GL1 to GLn are electrically connected to the gate driver GDC. The data lines DL1 to DLm are electrically connected to the data driver DDC.

Each of the pixels PX is connected to a corresponding one of the gate lines GL1 to GLn and to a corresponding one of the data lines DL1 to DLm.

The pixels PX may include a plurality of groups based on colors display thereon. For example, each pixel PX may display one of primary colors. The primary colors may include red, green, blue, and white. The present inventive concept is not limited thereto, and the primary colors may further include various colors such as yellow, cyan, and magenta.

The signal controller SC may be mounted on the main circuit board PB. As an exemplary embodiment, it is explained that the signal controller SC is mounted on the main circuit board PB, but the signal controller SC may be mounted on an external circuit board. In the latter case, the external circuit board may be electrically connected to the main circuit board PB.

The signal controller SC receives image data and control signals from an external graphic controller (not shown). The control signals may include a vertical synchronous signal that distinguishes frame sections, a row discrimination signal or a horizontal synchronous signal that distinguishes horizontal sections, a data enable signal whose level is high only when data are output to display a data input region, and clock signals. The present inventive concept however is not limited thereto, and the control signal may further include a plurality of signals that drive the gate driver GDC and the data driver DDC.

In response to the control signal, the signal controller SC generates gate control signals that control the gate driver GDC and transfers the gate control signals to the gate driver GDC. The signal controller SC generates data control signals that control the data driver DDC and transfers the data control signals to the data driver DDC.

The gate driver GDC may be provided in plural, and during the frame sections, the plurality of gate drivers GDC generate gate signals based on the gate control signals. The plurality of gate drivers GDC output the gate signals to the gate lines GL1 to GLn. The gate signals may be sequentially output to correspond to the horizontal sections. In addition, the plurality of gate drivers GDC may be electrically connected to each other.

It is explained that the gate driver GDC is provided in plural, but the present inventive concept is not limited thereto. For example, the gate driver GDC may be provided as a single gate driver, and may generate the gate signals. The display device DD including a single gate driver may be exemplarily applicable to a mobile phone and the like.

The gate driver GDC may include a gate driver chip GC and a gate circuit film GCB on which the gate driver chip GC is mounted. The gate driver chip GC and the gate circuit film GCB may each be provided in the number corresponding to the number of the gate driver GDC. Four gate drivers GDC are exemplarily illustrated in FIGS. 1-3, but the present inventive concept is not limited thereto.

The plurality of gate drivers GDC may be electrically connected to each other. In addition, the plurality of gate drivers GDC may be electrically connected to the signal controller SC, and may receive the gate control signals from the signal controller SC. For example, the non-display area NDA of the display panel DP may include a plurality of driving lines GDL that electrically connect the signal controller SC to the plurality of gate drivers GDC. The gate control signals may be supplied to corresponding gate drivers GDC through the plurality of driving lines GDL.

According to an embodiment of the present inventive concept, the gate circuit film GCB may be a flexible circuit film. The gate circuit film GCB may be disposed on at least one of side surfaces of the display panel DP not to overlap the display panel DP in a plan view. The gate circuit film GCB may be bonded to the side surface of the display panel DP, which bonding manner is referred to as a side bonding. On the side surface of the display panel DP, the gate circuit film GCB may be electrically connected to the gate lines GL1 to GLn, and may allow the gate lines GL1 to GLn to receive the gate signals that are output from the gate driver chip GC.

Alternatively, in the case of a top bonding where the gate circuit film GCB is bonded to a top surface of the first substrate 100 to overlap the first substrate 100 in a plan view, the non-display area NDA of the display panel DP may increase to secure an area in which the display panel DP and the gate circuit film GCB is bonded together as compared to the case of the side bonding. For example, a reduction of the non-display area NDA may be greater in the side-bonding case than in the top-bonding case, and as a result, the side-bonding case may have an increase of the display area DA of the display panel DP.

The display area DA and the non-display area NDA may be determined not based on a distance from an edge of the display panel DP but determined based on whether or not a top surface of the display panel DP displays an image. Therefore, for the display panel DP having the same size, when the non-display area NDA reduces, the display area DA may increase as much as the reduction of the non-display area NDA.

As an embodiment of the present inventive concept, the data driver DDC may be provided in plural. Based on the data control signal received from the signal controller SC, the data driver DDC generates grayscale voltages in accordance with image data. The data lines DL1 to DLm is provided with the grayscale voltages as data signals output from the data driver DDC.

It is explained that the data driver DDC is provided in plural, but the present inventive concept is not limited thereto. For example, the data driver DDC may be provided as a single data driver, and may generate the grayscale voltages. The display device DD including a single data driver may be exemplarily applicable to a mobile phone and the like.

Each data driver DDC may include a data driver chip DC and a data circuit film DCB on which the data driver chip DC is mounted. For example, the data driver chip DC and the data circuit film DCB may be provided in the number corresponding to the number of the data driver DDC.

The data circuit film DCB electrically connects the main circuit board PB to the first substrate 100. The data driver chip DC provides data signals to corresponding ones of the plurality of data lines DL1 to DLm.

According to an embodiment of the present inventive concept, the data circuit film DCB may be a flexible circuit film. The data circuit film DCB may be disposed on another side surfaces of the display panel DP. The data circuit film DCB may be side-bonded to the side surface of the display panel DP. On the side surface of the display panel DP, the data circuit film DCB may be electrically connected to the data lines DL1 to DLm and may allow the data lines DL1 to DLm to receive the data signals that are output from the data driver chip DC.

For example, the data circuit film DCB may be not bonded on the top surface of the first substrate 100 but bonded on the side surface of the display panel DP, which may result in an increase of the display area DA of the display panel DP.

According to an embodiment of the present inventive concept, the gate control signal output from the signal controller SC may be provided to the gate circuit film GCB via one of the data circuit films DCB that is disposed closest to the gate circuit film GCB. To achieve this configuration, the data circuit film DCB may further include a transfer line through which the gate circuit film GCB receives the gate control signal that is output from the signal controller SC.

Figure 4:
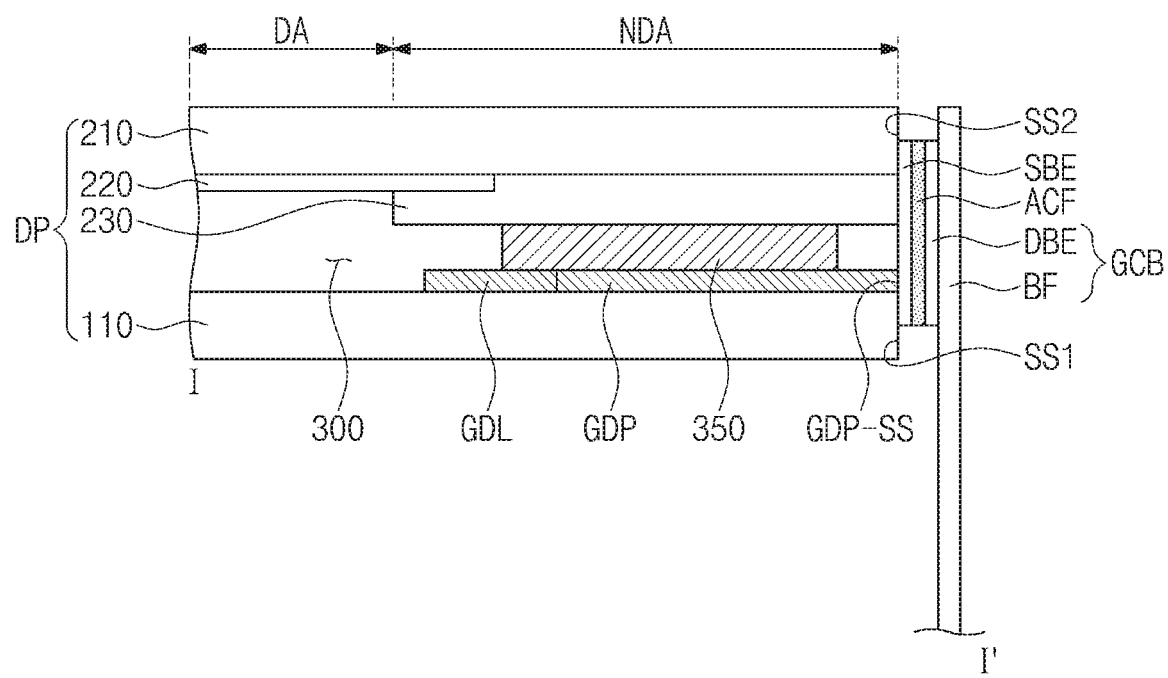
FIG. 4 illustrates a cross-sectional view taken along line I-I' of FIG. 3.
Figure 5:
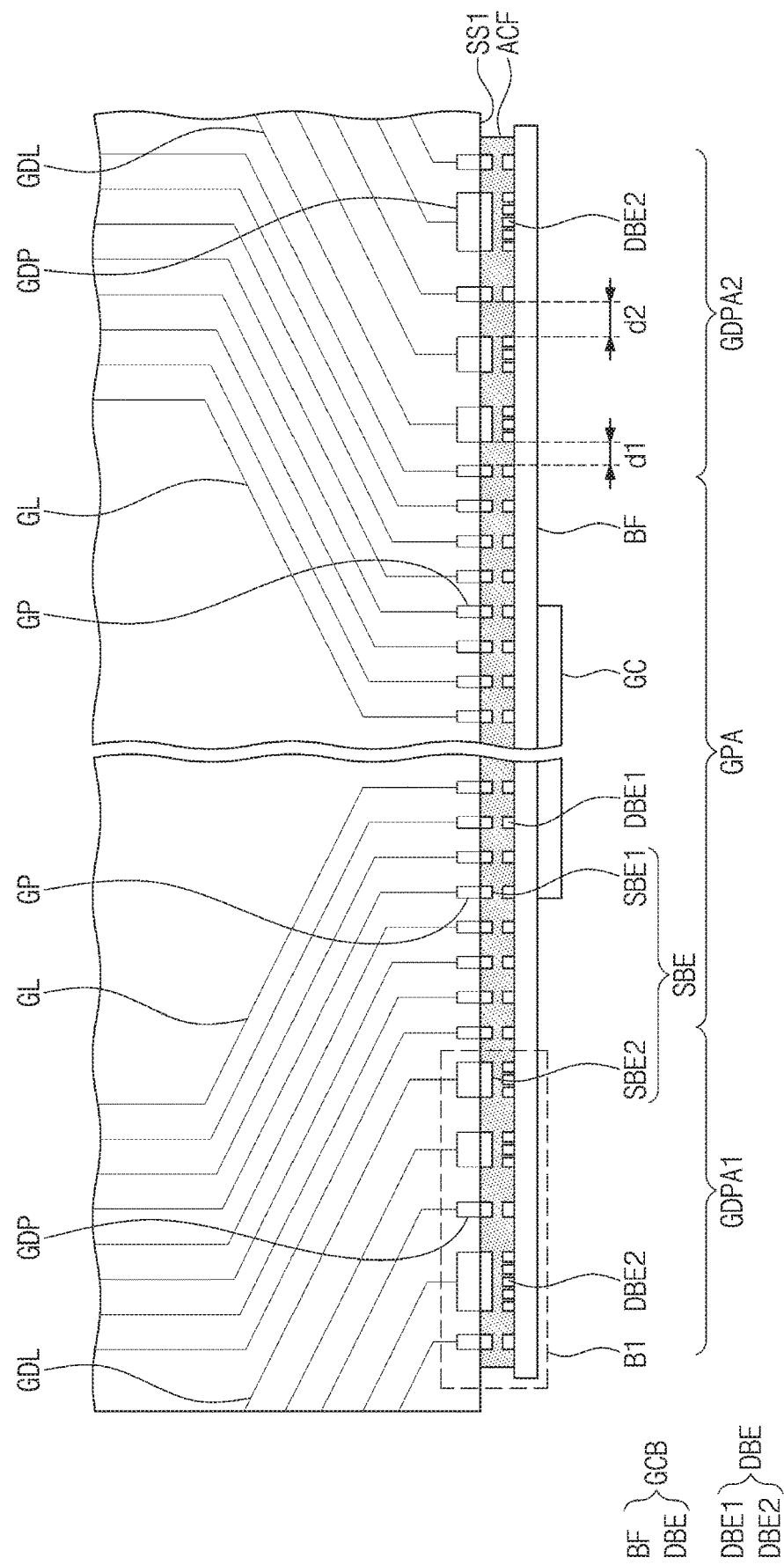
FIG. 5 illustrates an enlarged plan view showing section A1 of FIG. 3.

FIG. 4 illustrates a cross-sectional view taken along line I-I' of FIG. 3. FIG. 5 illustrates an enlarged plan view showing section A1 of FIG. 3.

Referring to FIGS. 4 and 5, the display panel DP includes the first substrate 100, the second substrate 200, the liquid crystal layer 300, and a sealant 350.

The first substrate 100 includes a first base substrate 110, gate lines GL, driving lines GDL, gate pads GP, and driving pads GDP. The first base substrate 110 may be a glass substrate, a metal substrate, a plastic substrate, or the like.

The gate lines GL may extend from the display area DA of the first base substrate 110 to the non-display area NDA of the first substrate 110, and the driving lines GDL, the gate pads GP, and the driving pads GDP are disposed in the non-display area NDA of the first base substrate 110. The gate pads GP may extend from the gate lines GL, and the driving pads GDP may extend from the driving lines GDL. Each of the gate lines GL, the driving lines GDL, and the gate pads GP, and the driving pads GDP includes a metallic material. For example, each of the gate lines GL, the driving lines GDL, and the gate pads GP, and the driving pads GDP may include one or more of copper, aluminum, molybdenum, a copper alloy, an aluminum alloy, and a molybdenum alloy.

The first substrate 100 further includes a plurality of dielectric layers and any electrode that forms the pixel (see PX of FIG. 2), but illustrations of these are omitted for convenience of description.

Side surfaces of the gate pads GP and side surfaces GDP-SS of the driving pads GDP may be aligned with a side surface SS1 of the first base substrate 110. For example, one end portions of the gate pads GP may be aligned with the side surface SS1 of the first base substrate 110, and other end portions of the gate pads GP may be connected to the gate lines GL. One end portions of the driving pads GDP may be aligned with the side surface SS1 of the first base substrate 110, and other end portions of the driving pads GDP may be connected to the driving lines GDL.

The second substrate 200 may include a second base substrate 210, a conductive layer 220, and a black matrix 230. The second base substrate 210 is combined with the first base substrate 110 while facing the first base substrate 110. The second base substrate 210 may be a glass substrate, a metal substrate, a plastic substrate, or the like.

The conductive layer 220 may be a common electrode to which a common voltage is applied. The common electrode may face a pixel electrode (not shown) provided on the first substrate 100. The conductive layer 220 may include a transparent conductive material, for example, indium tin oxide.

The black matrix 230 may be disposed on the non-display area NDA, and may prevent leakage of light through the non-display area NDA. The black matrix 230 may include a light-shielding material.

The liquid crystal layer 300 may be interposed between the first substrate 100 and the second substrate 200 in an area corresponding to the display area DA. Each pixel (see PX of FIG. 2) may be provided with a liquid crystal capacitor that is formed by the common electrode, the liquid crystal layer 300, and the pixel electrode.

The sealant 350 may be interposed between the first substrate 100 and the second substrate 200 to surround the display area DA. Between the first and second substrates 100 and 200, the sealant 350 may be provided along edges of the first and second substrates 100 and 200. The first and second substrates 100 and 200 may be combined with each other through the sealant 350, and a space between the first and second substrates 100 and 200 may be sealed by the sealant 350. The sealant 350 may include an adhesive material. On the non-display area NDA, the sealant 350 may overlap the gate pads GP and the driving pads GDP in a plan view. Although FIG. 4 shows that the gate pads GP and the driving pads GDP overlap the sealant 350, data pads connected to the data lines (see DL of FIG. 2) may also overlap the sealant 350 in a plan view.

The display panel DP may further include side electrodes SBE formed on one side surface of the display panel DP. The side electrodes SBE may include a plurality of first side electrodes SBE1 connected to the gate pads GP and a plurality of second side electrodes SBE2 connected to the driving pads GDP.

The plurality of first side electrodes SBE1 may be disposed to have a one-to-one correspondence to the gate pads GP. Each first side electrode SBE1 may be in direct contact with the side surface of each of the gate pads GP. Accordingly, each first side electrode SBE1 may be electrically connected to a corresponding gate pad GP.

The plurality of second side electrodes SBE2 may be disposed to have a one-to-one correspondence to the driving pads GDP. Each second side electrode SBE2 may be in direct contact with the side surface GDP-SS of each of the driving pads GDP. Accordingly, each second side electrode SBE2 may be electrically connected to a corresponding driving pad GDP.

The first and second side electrodes SBE1 and SBE2 may be disposed on the side surface SS1 of the first base substrate 110 and the side surface SS2 of the second base substrate 210. As an example embodiment, the side surface SS1 of the first base substrate 110 and the side surface SS2 of the second base substrate 210 may be aligned with the side surfaces of the gate pads GP and the side surfaces GDP-SS of the driving pads GDP. Each of the first side electrodes SBE1 and the second side electrode SBE2 may partially cover the side surface SS1 of the first base substrate 110 and the side surface SS2 of the second base substrate 210 on which side surfaces of the first base substrate 110 and the second base substrate 210 SS1 and SS2 are aligned with the side surfaces GDP-SS of the driving pads GDP.

Each of the first and second side electrodes SBE1 and SBE2 may be formed of a metallic material including copper (Cu), silver (Ag), gold (Au), or aluminum (A1). Each of the first and second side electrodes SBE1 and SBE2 may be formed on the side surface of the display panel DP through a silk screen method or a method in which a metallic material is deposited and then a laser is used to form an electrode.

The gate circuit film GCB on which the driving chip GC is disposed is attached to the side surface of the display panel DP. The gate circuit film GCB includes a base film BF and a plurality of lead electrodes DBE disposed on one surface of the base film BF. The gate circuit film GCB may be disposed to cause the lead electrodes DBE to face the side electrodes SBE. The lead electrodes DBE may include a plurality of first lead electrodes DBE1 that corresponds to the first side electrodes SBE1 and a plurality of second lead electrodes DBE2 that corresponds to the second side electrodes SBE2.

An anisotropic conductive film ACF is disposed between the gate circuit film GCB and the side surface of the display panel DP. The anisotropic conductive film ACF includes conductive particles formed in an adhesive film. The conductive particles electrically connect the side electrodes SBE to the lead electrodes DBE. Accordingly, the side electrodes SBE may be electrically connected through the anisotropic conductive film ACF to the lead electrodes DBE that corresponds to the side electrodes SBE. In addition, the anisotropic conductive film ACF may fix the gate circuit film GCB on the side surface of the display panel DP.

As illustrated in FIG. 5, the display panel DP may include a first pad region GPA on which the plurality of gate pads GP are disposed and a second pad region GDPA1 and GDPA2 on which the plurality of driving pads GDP are disposed. In the first pad region GPA, the gate pads GP may be arranged at a regular interval. In the second pad region GDPA1 and GDPA2, the driving pads GDP may not be arranged at a regular interval. For example, the driving pads GDP whose potential difference is small may be spaced apart from each other at a first interval d1, and the driving pads GDP whose potential difference is large may be spaced apart from each other at a second interval d2. The second interval d2 may be greater than the first interval d1.

Figure 6:
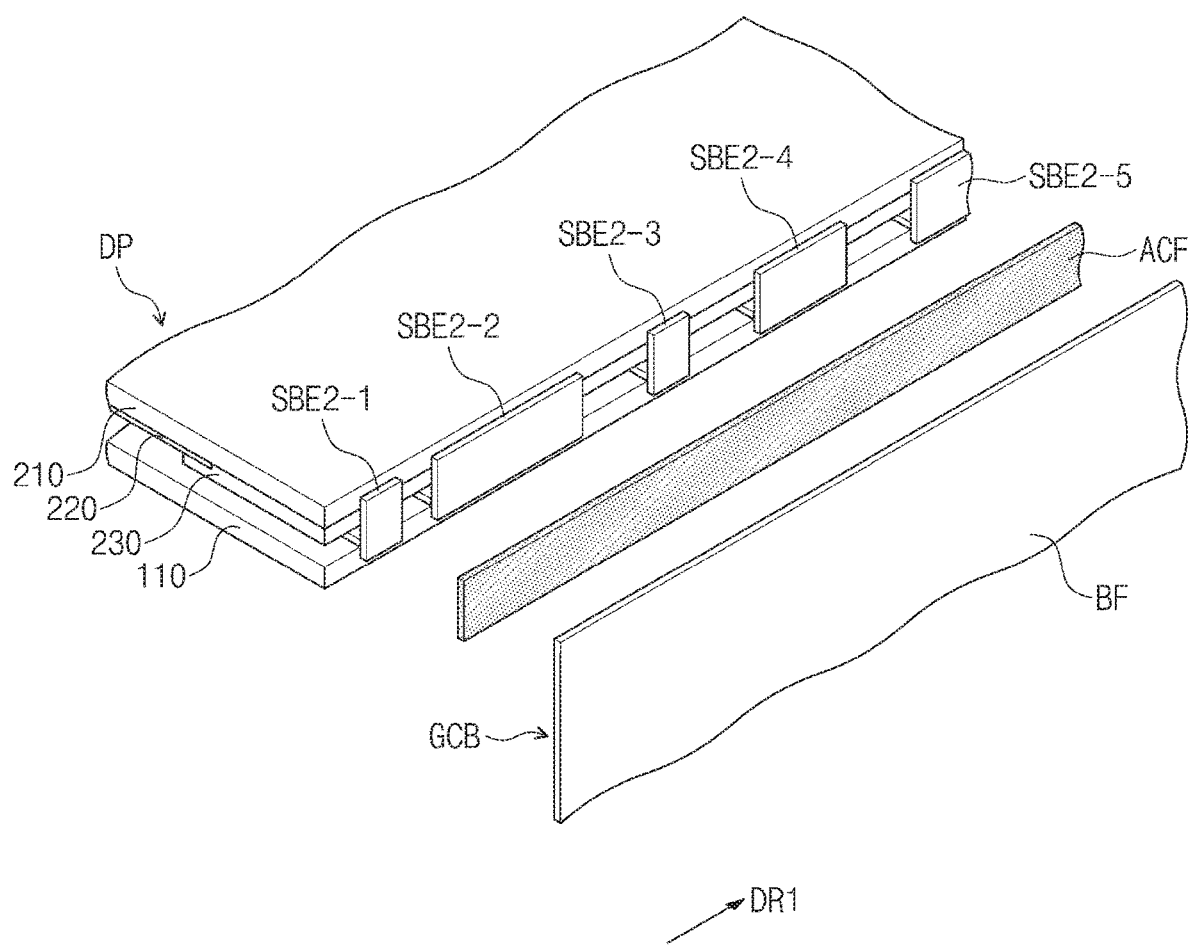
FIG. 6 illustrates an exploded perspective view showing section B1 of FIG. 5.
Figure 7:
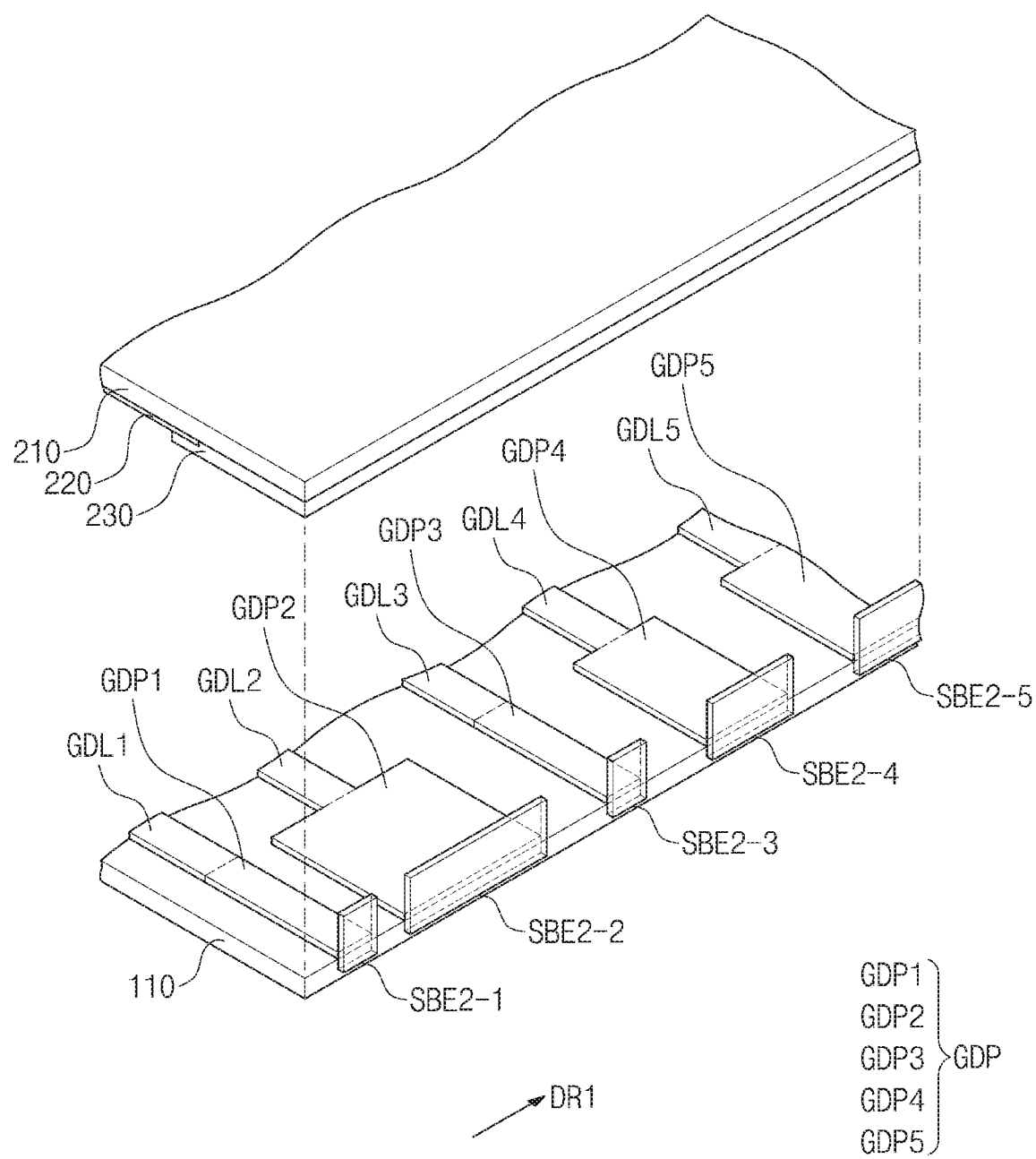
FIG. 7 illustrates an exploded perspective view showing a display panel of FIG. 6.
Figure 8:
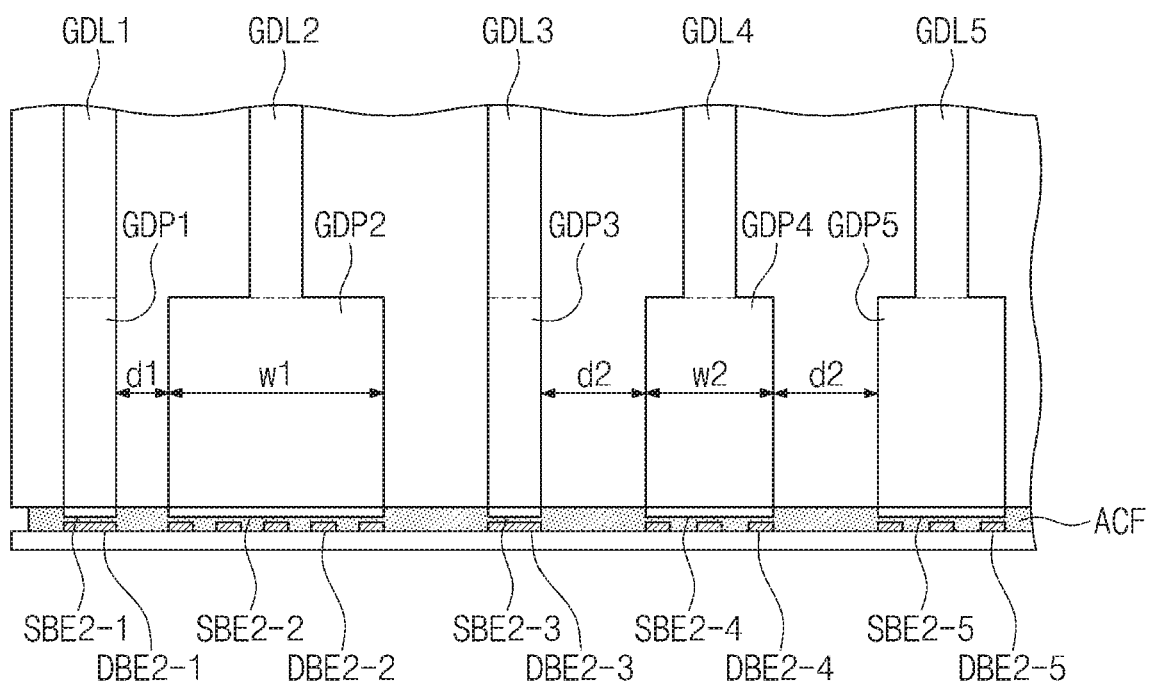
FIG. 8 illustrates an enlarged plan view showing section B1 of FIG. 5.

FIG. 6 illustrates an exploded perspective view showing section B1 of FIG. 5. FIG. 7 illustrates an exploded perspective view showing a display panel of FIG. 6. FIG. 8 illustrates an enlarged plan view showing section B1 of FIG. 5.

Referring to FIGS. 5 to 8, the driving pad GDP may be provided in plural. Although FIGS. 6 to 8 show only five driving pads GDP1 to GDP5, but the number of the driving pads GDP is not limited thereto.

The plurality of driving pads GDP1 to GDP5 may be sequentially disposed in the first direction DR1. An interval between the plurality of driving pads GDP1 to GDP5 may be determined based on a potential difference therebetween. For example, when two adjacent driving pads have therebetween a potential difference less than a reference value, the two adjacent driving pads may be spaced apart from each other at the first interval d1; when two adjacent driving pads have therebetween a potential difference greater than the reference value, the two adjacent driving pads may be spaced apart from each other at the second interval d2. As an embodiment of the present inventive concept, the reference value may be equal to or greater than about 7 V.

Among the plurality of driving pads GDP1 to GDP5, a first driving pad GDP1 may be connected to a first driving line GDL1 and may receive a first control signal, and a second driving pad GDP2 may be connected to a second driving line GDL2 and may receive a second control signal. For example, the first control signal may be a start signal that drives the gate driver chip GC. The first control signal may have about 1.2 V. For example, the second control signal may be a driving voltage that drives the gate driver chip GC. In this case, the second control signal may have about 3.3 V. The first and second control signals may have a potential difference of about 2.1 V therebetween. Because the potential difference between the first and second control signals is lower than the reference value, the first and second driving pads GDP1 and GDP2 may be spaced apart from each other at the first interval d1.

A third driving pad GDP3 may be connected to a third driving line GDL3 and may receive a third control signal, and a fourth driving pad GDP4 may be connected to a fourth driving line GDL4 and may receive a fourth control signal. For example, the third control signal may be a clock signal that is supplied to the gate driver chip GC. The clock signal may have about 3.3 V. For example, the fourth control signal may be a gate-on-voltage that determines a high level of the gate signal. In this case, the fourth control signal may have about 29 V. The third and fourth control signals may have a potential difference of about 25.7 V therebetween. Because the potential difference between the third and fourth control signals is greater than the reference value, the third and fourth driving pads GDP3 and GDP4 may be spaced apart from each other at the second interval d2. A fifth driving pad GDP5 may be connected to a fifth driving line GDL5 and may receive a fifth control signal. The fifth control signal may have a potential difference greater than the reference value with the fourth control signal. Thus, the fifth driving pad GDP5 may be spaced apart from the fourth driving pad GDP4 at the second interval d2.

As an embodiment of the present inventive concept, the first interval d1 may be less than about 140 μm, for example, from about 30 μm to about 70 μm. The second interval d2 may be about 140 μm or higher.

FIGS. 6 to 8 illustrate an example where the driving lines GDL receive control signals that control the driving of the gate driver chip GC, but the present inventive concept is not limited thereto. For example, the driving lines GDL may further include lines that supply the display panel DP with signals, such as a common voltage signal and a ground voltage signal, which are required to drive the display panel DP.

The second side electrodes SBE2 include a plurality of second side electrodes SBE2-1 to SBE2-5. The plurality of second side electrodes SBE2-1 to SBE2-5 may be sequentially disposed in the first direction DR1. An interval between the plurality of second side electrodes SBE2-1 to SBE2-5 may also be determined based on a potential difference therebetween. For example, when two adjacent side electrodes have therebetween a potential difference less than the reference value, the two adjacent side electrodes may be spaced apart from each other at the first interval d1. When two adjacent side electrodes have therebetween a potential difference greater than the reference value, the two adjacent side electrodes may be spaced apart from each other at the second interval d2.

The base film BF is provided thereon with the second lead electrodes DBE2 that correspond to the second side electrodes SBE2. The second lead electrodes DBE2 include a plurality of second lead electrodes DBE2-1 to DBE2-5 that respectively correspond to the plurality of second side electrodes SBE2-1 to SBE2-5. The plurality of second lead electrodes DBE2-1 to DBE2-5 may be sequentially disposed in the first direction DR1. An interval between the plurality of second lead electrodes DBE2-1 to DBE2-5 may also be determined based on a potential difference therebetween. For example, when two adjacent side electrodes have therebetween a potential difference less than the reference value, the two adjacent side electrodes may be spaced apart from each other at the first interval d1. When two adjacent side electrodes have therebetween a potential difference greater than the reference value, the two adjacent side electrodes may be spaced apart from each other at the second interval d2.

Among the plurality of second lead electrodes DBE2-1 to DBE2-5, some second lead electrodes DBE2-2, DBE2-4, and DBE2-5 may each include a plurality of sub-lead electrodes. The number of the sub-lead electrodes may be changed depending on a width of a corresponding one of the driving pads GDP2, GDP4, and GDP5. For example, the second driving pad GDP2 may have a first width w1, and the fourth driving pad GDP4 may have a second width w2. The first width w1 may be greater than the second width w2. For example, the second lead electrode DBE2-2 that corresponds to the second driving pad GDP2 may include five sub-lead electrodes, and the second lead electrode DBE2-4 that corresponds to the fourth driving pad GDP4 may include three sub-lead electrodes.

As such, based on the potential difference, the driving pads GDP, the second side electrodes SBE2, and the second lead electrodes DBE2 may be adjusted in their respective intervals, which may result in an improvement in bonding reliability degradation caused by electrochemical corrosion between the display panel DP and the gate circuit film GCB.

For example, when each of the second side electrodes SBE2 is formed of a metallic material including silver (Ag), and when each of the second lead electrodes DBE2 is formed of a metallic material including copper (Cu), galvanic corrosion may occur at the second side electrodes SBE2. In particular, the corrosion severely appears between two second side electrodes SBE2 whose potential difference is large, and two adjacent second side electrodes SBE2 suffer from an electrical short circuit resulting from the corrosion.

However, no galvanic corrosion may occur when an interval of equal to or greater than about 140 μm is provided between two second side electrodes SBE2 whose potential difference is large. As a result, it may be possible to prevent bonding reliability degradation caused by electrochemical corrosion between the display panel DP and the gate circuit film GCB.

Figure 9:
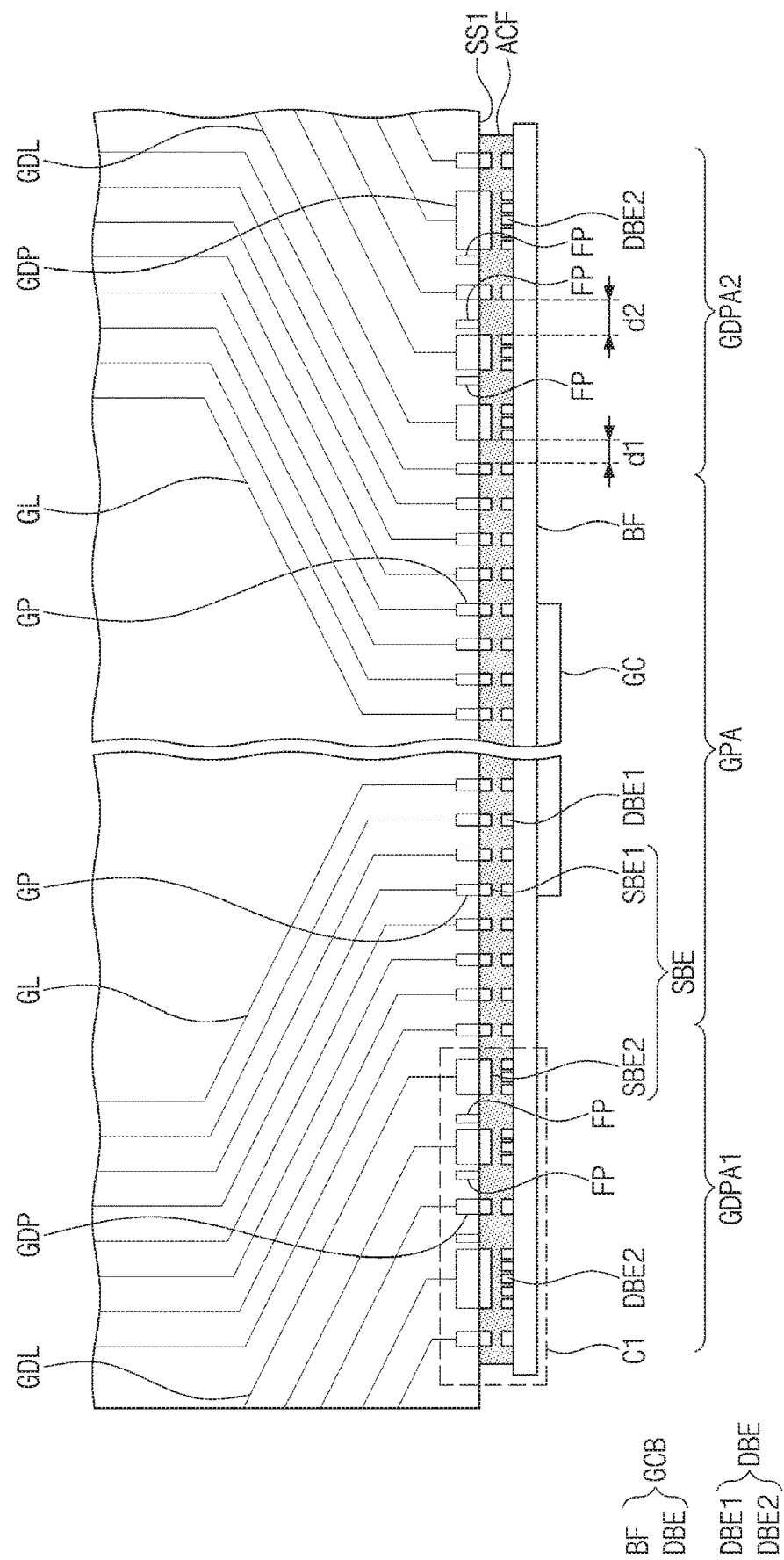
FIG. 9 illustrates an enlarged plan view showing section A1 of FIG. 3.
Figure 10:
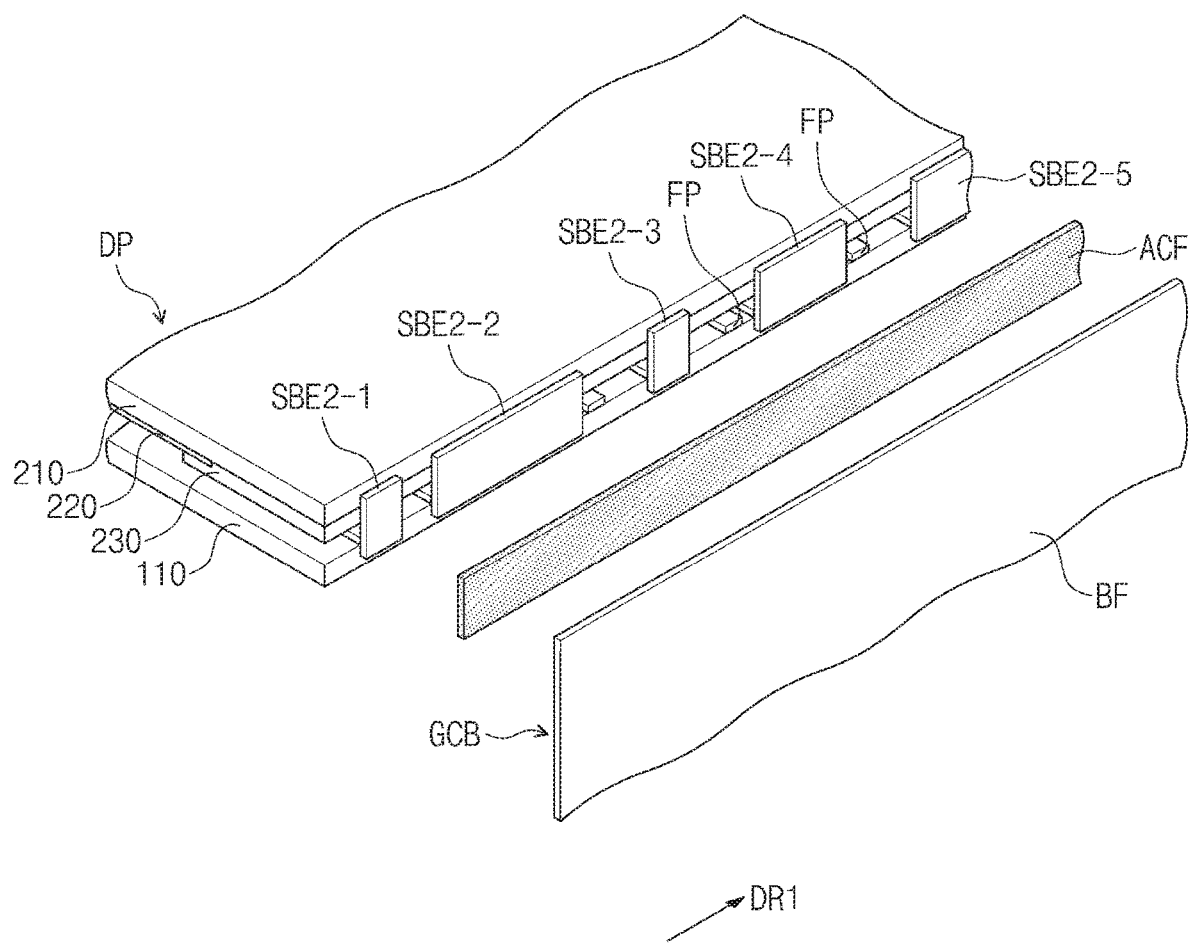
FIG. 10 illustrates an exploded perspective view showing section C1 of FIG. 9.
Figure 11:
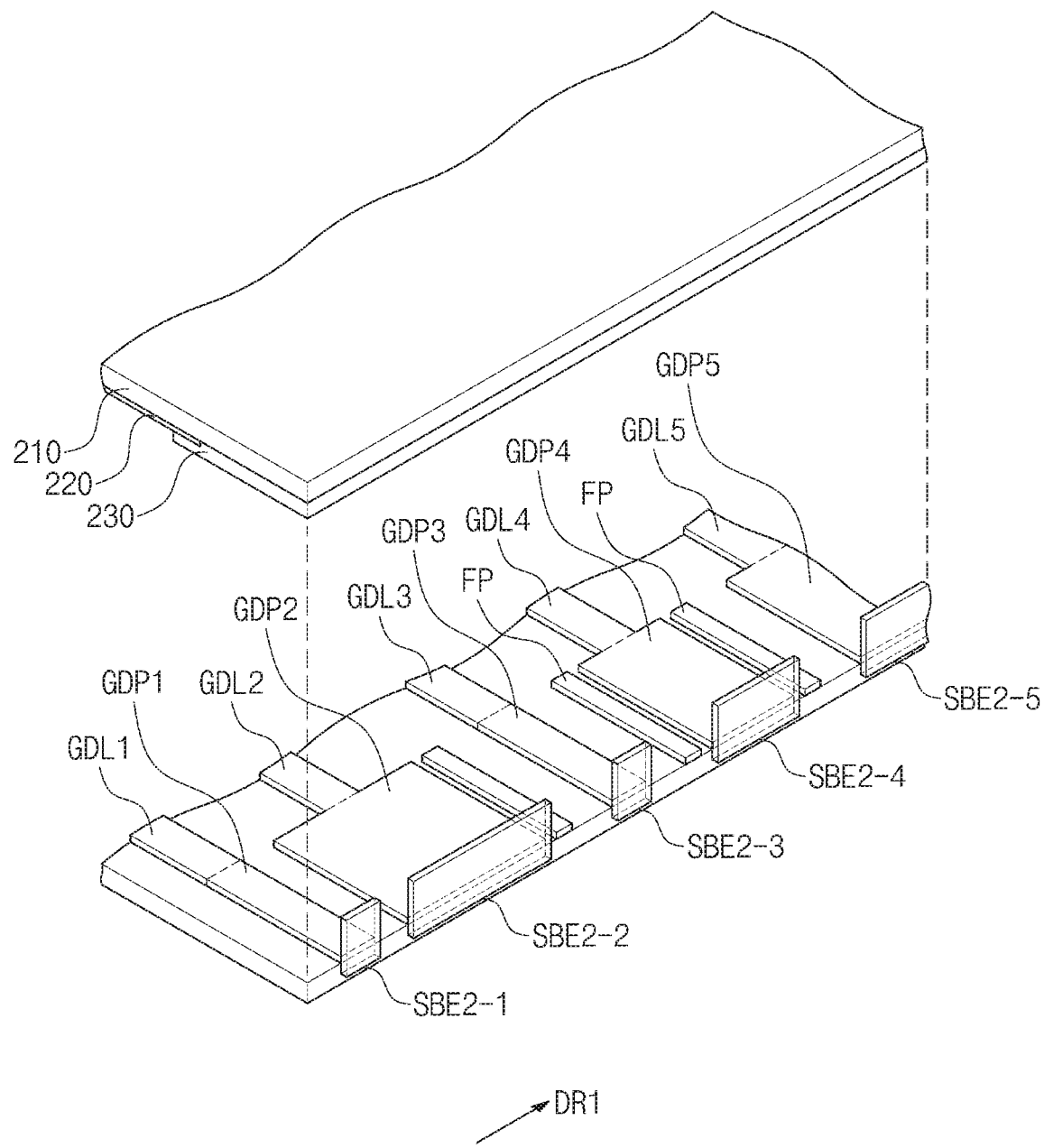
FIG. 11 illustrates an exploded perspective view showing a display panel of FIG. 10.
Figure 12:
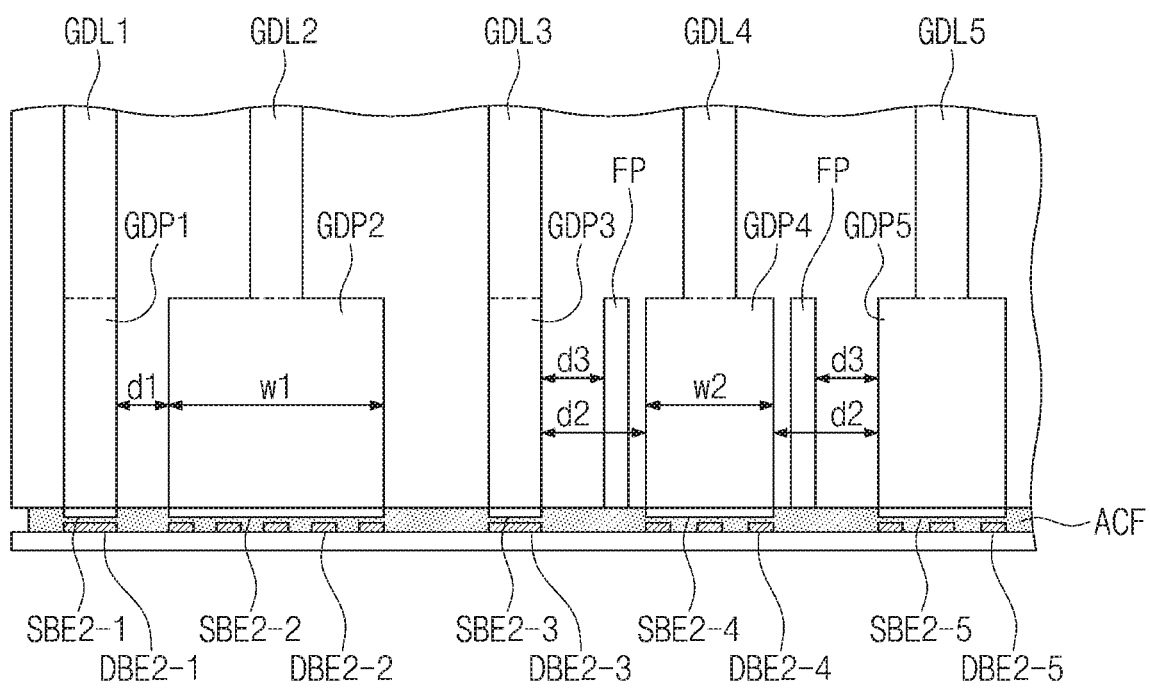
FIG. 12 illustrates an enlarged plan view showing section C1 of FIG. 9.

FIG. 9 illustrates an enlarged plan view showing section A1 of FIG. 3. FIG. 10 illustrates an exploded perspective view showing section C1 of FIG. 9. FIG. 11 illustrates an exploded perspective view showing a display panel of FIG. 10. FIG. 12 illustrates an enlarged plan view showing section C1 of FIG. 9.

Referring to FIGS. 9 to 12, the gate lines GL extend from the display area DA of the first base substrate 110 to an edge of the first base substrate 110, and the driving lines GDL, the gate pads GP, and the driving pads GDP are disposed in the non-display area NDA of the first base substrate 110. The gate pads GP may extend from the gate lines GL, and the driving pads GDP may extend from the driving lines GDL.

Although FIGS. 9 to 12 show only five driving pads GDP, the number of the driving pads GDP is not limited thereto.

The display panel DP further includes floating pads FP disposed between at least two of the plurality of driving pads GDP1 to GDP5. The floating pads FP may have a floating state.

The plurality of driving pads GDP1 to GDP5 may be sequentially disposed in the first direction DR1. A potential difference between the plurality of driving pads GDP1 to GDP5 may determine whether or not the floating pads FP are disposed between adjacent driving pads. For example, when the potential difference between two adjacent driving pads is less than a reference value, the floating pads FP is not disposed between the two adjacent driving pads. For another example, when the potential difference between two adjacent driving pads is greater than the reference value, the floating pads FP may be disposed between the two adjacent driving pads. As an embodiment of the present inventive concept, the reference value may be equal to or greater than about 7 V.

Among the plurality of driving pads GDP1 to GDP5, a first driving pad GDP1 may be connected to a first driving line GDL1 and may receive a first control signal, and a second driving pad GDP2 may be connected to a second driving line GDL2 and may receive a second control signal. For example, the first control signal may be a start signal (STV) that drives the gate driver chip GC. The first control signal may have about 1.2 V. For example, the second control signal may be a driving voltage (VDD) that drives the gate driver chip GC. In this case, the second control signal may have about 3.3 V. The first and second control signals may have a potential difference of about 2.1 V therebetween. Because the potential difference between the first and second control signals is lower than the reference value, the floating pads FP may not be disposed between the first and second driving pads GDP1 and GDP2.

The first and second driving pads GDP1 and GDP2 may be spaced apart from each other at a first interval d1. The first interval d1 may be less than about 140 μm.

A third driving pad GDP3 may be connected to a third driving line GDL3 and may receive a third control signal, and a fourth driving pad GDP4 may be connected to a fourth driving line GDL4 and may receive a fourth control signal. For example, the third control signal may be a clock signal (CPV) that is supplied to the gate driver chip GC. The clock signal may have about 3.3 V. For example, the fourth control signal may be a gate-on-voltage (Von) that determines a high level of the gate signal. In this case, the fourth control signal may have about 29 V. The third and fourth control signals may have a potential difference of about 25.7 V therebetween. Because the potential difference between the third and fourth control signals is greater than the reference value, the floating pad FP may be disposed between the third and fourth driving pads GDP3 and GDP4.

The third and fourth driving pads GDP3 and GDP4 may be spaced apart from each other at a second interval d2. The second interval d2 may be greater than about 140 μm. The floating pads FP may be disposed more adjacent to the fourth driving pad GDP4 than to the third driving pad GDP3. The floating pads FP and the fourth driving pad GDP4 may be spaced apart from each other at a third interval d3. The third interval d3 may be equal to or greater than the first interval d1. A fifth driving pad GDP5 may be connected to a fifth driving line GDL5 and may receive a fifth control signal. The fifth control signal may have a potential difference greater than the reference value with the fourth control signal. Thus, the fifth driving pad GDP5 may be spaced apart from the fourth driving pad GDP4 at the second interval d2 and a floating pad FP may be disposed between the fourth driving pad GDP4 and the fifth driving pad PDP5.

The second side electrodes SBE2 include a plurality of second side electrodes SBE2-1 to SBE2-5. The plurality of second side electrodes SBE2-1 to SBE2-5 may be sequentially disposed in the first direction DR1. Each of the plurality of second side electrodes SBE2-1 to SBE2-5 is in contact with a side surface of a corresponding one of the plurality of driving pads GDP1 to GDP5. An interval between the plurality of second side electrodes SBE2-1 to SBE2-5 may be determined based on a potential difference between second side electrodes disposed adjacent to each other. For example, when two adjacent side electrodes have therebetween a potential difference less than the reference value, the two adjacent side electrodes may be spaced apart from each other at the first interval d1. When two adjacent side electrodes have therebetween a potential difference greater than the reference value, the two adjacent side electrodes may be spaced apart from each other at the second interval d2 which is greater than the first interval d1. The plurality of second side electrodes SBE2-1 to SBE2-5 are not in contact with a side surface of the floating pad FP.

The base film BF is provided thereon with the second lead electrodes DBE2 that corresponds to the second side electrodes SBE2. The second lead electrodes DBE2 include a plurality of second lead electrodes DBE2-1 to DBE2-5 that respectively disposed correspond to the plurality of second side electrodes SBE2-1 to SBE2-5. The plurality of second lead electrodes DBE2-1 to DBE2-5 may be sequentially disposed in the first direction DR1. An interval between the plurality of second lead electrodes DBE2-1 to DBE2-5 may also be determined based on a potential difference between side electrode disposed adjacent to each other. For example, when two adjacent side electrodes have therebetween a potential difference less than the reference value, the two adjacent side electrodes may be spaced apart from each other at the first interval d1. When two adjacent side electrodes have therebetween a potential difference greater than the reference value, the two adjacent side electrodes may be spaced apart from each other at the second interval d2 which is greater than the first interval d1.

Among the plurality of second lead electrodes DBE2-1 to DBE2-5, some second lead electrodes DBE2-2, DBE2-4, and DBE2-5 may each include a plurality of sub-lead electrodes. The number of the sub-lead electrodes may be changed depending on a width of a corresponding one of the driving pads GDP2, GDP4, and GDP5. For example, the second driving pad GDP2 may have a first width w1, and the fourth driving pad GDP4 may have a second width w2. The first width w1 may be greater than the second width w2. For example, the second lead electrode DBE2-2 that corresponds to the second driving pad GDP2 may include five sub-lead electrodes, and the second lead electrode DBE2-4 that corresponds to the fourth driving pad GDP4 may include three sub-lead electrodes.

As such, based on the potential difference, it may be determined whether or not the floating pad FP is disposed between the driving pads GDP, and the second side electrodes SBE2 and the second lead electrodes DBE2 may be adjusted in their respective intervals, which may prevent bonding reliability degradation caused by electrochemical corrosion such as galvanic corrosion between the display panel DP and the gate circuit film GCB.

Figure 13:
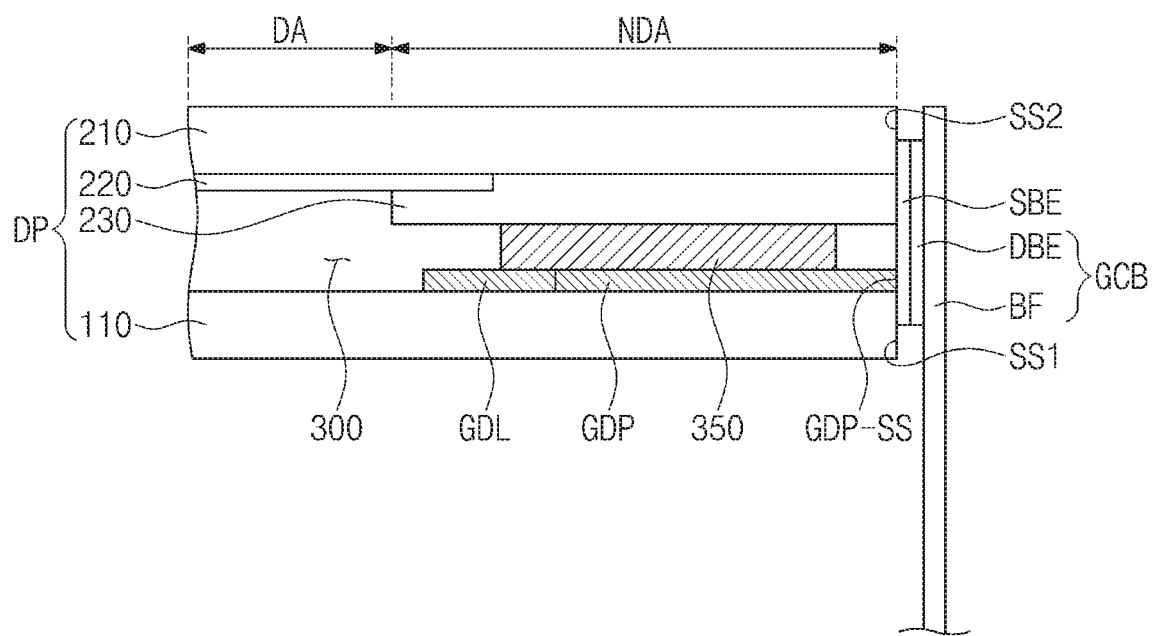
FIG. 13 illustrates a cross-sectional view taken along line I-I' of FIG. 3.
Figure 14:
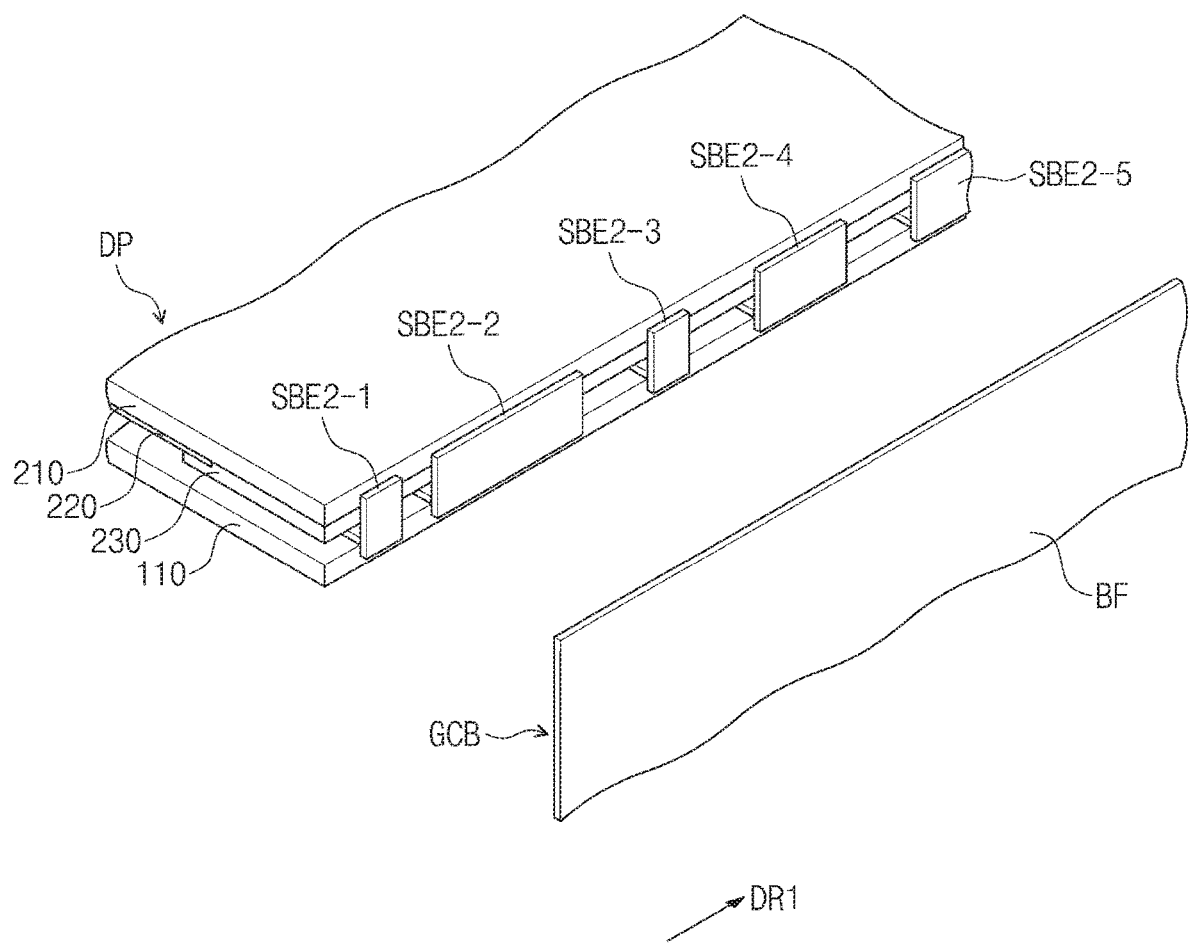
FIG. 14 illustrates an exploded perspective view showing a gate circuit film and a display panel of FIG. 13.
Figure 15:
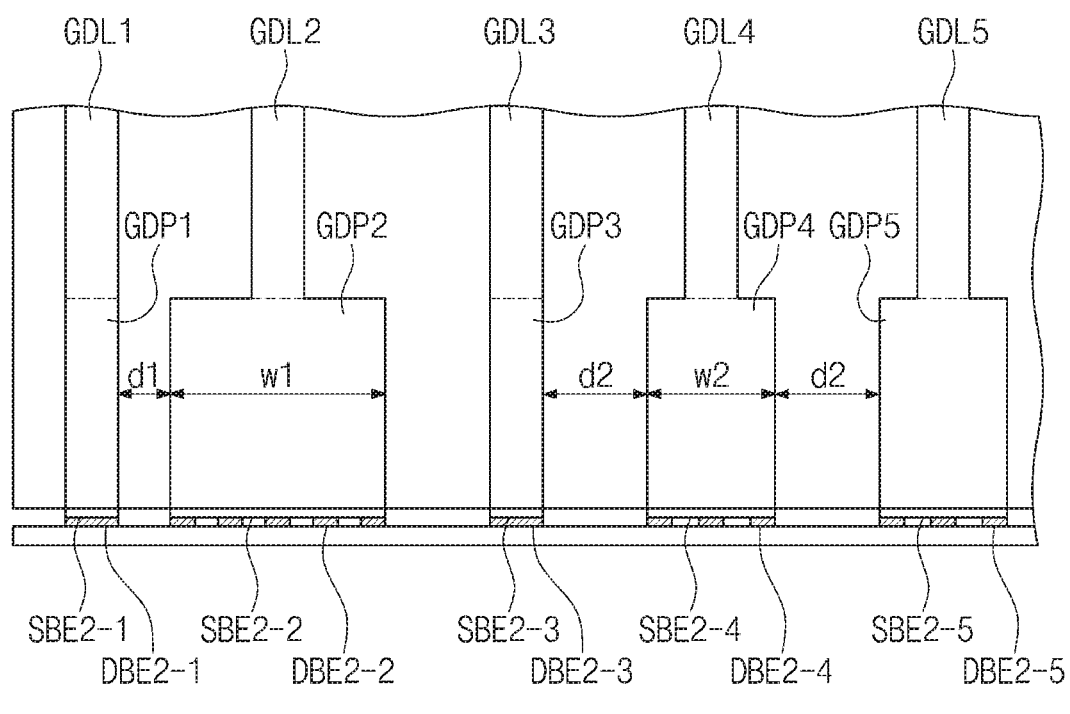
FIG. 15 illustrates an enlarged plan view showing a combination of a gate circuit film and a display panel of FIG. 14.

FIG. 13 illustrates a cross-sectional view taken along line I-I' of FIG. 3. FIG. 14 illustrates an exploded perspective view showing a gate circuit film and a display panel of FIG. 13. FIG. 15 illustrates an enlarged plan view showing a combination of a gate circuit film and a display panel of FIG. 14. The following will describe an embodiment where a display panel and a gate circuit film are bonded by an ultrasonic boding process with reference to FIGS. 13 to 15.

Referring to FIGS. 13 to 15, an ultrasonic bonding process attaches the gate circuit film GCB to the side surface of the display panel DP. The ultrasonic bonding process may be performed using an ultrasonic vibration apparatus. The ultrasonic vibration apparatus may generate vibration having a predetermined frequency. For example, the ultrasonic vibration apparatus may generate ultrasonic vibration that vibrates at a frequency of about 35 kHz.

The ultrasonic vibration produces friction heat at contact surfaces between the lead electrodes DBE and the side electrodes SBE. The friction heat melts the contact surfaces between the lead electrodes DBE and the side electrodes SBE, and thus metal diffusion occurs. The lead electrodes DBE are then combined with the side electrodes SBE. The bonding method discussed above may be defined to refer to the ultrasonic bonding process.

Except for the ultrasonic bonding process that attaches the gate circuit film GCB to the display panel DP as illustrated in FIGS. 13 to 15, the arrangement of the driving pads GDP, the side electrodes SBE, and the lead electrodes DBE is similar to that shown in FIGS. 1 to 12. A repetitive explanation will thus be omitted.

In contrast, the anisotropic conductive film (see ACF of FIG. 4) may not be interposed between the lead electrodes DBE and the side electrodes DBE, and when the lead electrodes DBE are in direct contact with the side electrodes DBE using the ultrasonic bonding process, the second interval d2 may be adjusted to have a value of greater than about 140 μm, which is a second interval when using the anisotropic conductive film ACF, for example, of 150 μm or higher.

As such, base on the potential difference, the driving pads GDP, the second side electrodes SBE2, and the second lead electrodes DBE2 may be adjusted in their respective intervals, or the floating pads FP may be disposed between adjacent driving pads GDP, which may prevent bonding reliability degradation caused by electrochemical corrosion between the display panel DP and the gate circuit film GCB.

In a display device according to some embodiments of the present inventive concept, an interval between two adjacent side electrodes whose potential difference is large may be set different from an interval between two side electrodes whose potential difference is small, and as a result, it may be possible to prevent bonding reliability degradation caused by electrochemical corrosion between a display panel and a gate circuit film.

Although the embodiments have been described with reference to a number of illustrative examples thereof, it will be understood by those of ordinary skill in the art that various changes in form and details may be made without departing from the spirit and scope of the present inventive concept as set forth in the following claims. Thus, the technical scope of the present inventive concept is not limited by the embodiments and examples described above, but by the following claims.

What is claimed is:

1. A display device, comprising: a display panel which includes a display area and a non-display area surrounding the display area, the display panel including a plurality of driving lines disposed in the non-display area, and a plurality of driving pads connected to the plurality of driving lines; a plurality of side electrodes disposed on a side surface of the display panel and in contact with side surfaces of the plurality of driving pads; and a flexible film that includes a plurality of lead electrodes in contact with the plurality of side electrodes, wherein the plurality of driving pads include a first driving pad, a second driving pad and a third driving pad which are sequentially arranged in a first direction, and wherein a first interval between the first driving pad and the second driving pad is different from a second interval between the second driving pad and the third driving pad, wherein the first driving pad receives a first control signal having a first potential, the second driving pad receives a second control signal having a second potential, the third driving pad receives a third control signal having a third potential, and a potential difference between the first control signal and the second control signal is different from a potential difference between the second control signal and the third control signal.

2. The display device of claim 1, wherein
the potential difference between the first control signal and the second control signal is less than a reference value,
the first driving pad and the second driving pad are spaced apart at the first interval,
the potential difference between the second control signal and the third control signal is greater than the reference value, and
the second driving pad and the third driving pad are spaced apart at the second interval greater than the first interval.

3. The display device of claim 2, wherein the reference value is equal or greater than about 7 V.

4. The display device of claim 2, wherein
the first interval is less than about 140 μm, and
the second interval is equal to or greater than about 140 μm.

5. The display device of claim 2, wherein the plurality of side electrodes include:
a first side electrode in contact with a side surface of the first driving pad;
a second side electrode in contact with a side surface of the second driving pad; and
a third side electrode in contact with a side surface of the third driving pad,
wherein the first side electrode and second side electrode are spaced apart at the first interval, and
wherein the second side electrode and the third side electrode are spaced apart at the second interval greater than the first interval.

6. The display device of claim 5, wherein
the plurality of side electrodes include silver (Ag), and
the plurality of driving pads include copper (Cu).

7. The display device of claim 1, further comprising a driver chip mounted on the flexible film,
wherein the plurality of driving lines have electrical connection with the driver chip and supply control signals required to drive the driver chip.

8. The display device of claim 7,
wherein the display panel includes:
a pixel on the display area;
a data line connected to the pixel; and
a gate line connected to the pixel, and
wherein the driver chip includes:
a data driver chip that outputs a data signal provided to the data line; and
a gate driver chip that outputs a gate signal provided to the gate line.

9. The display device of claim 8, wherein the plurality of driving lines provide the gate driver chip with a control signal required to drive the gate driver chip.

10. The display device of claim 1, further comprising an anisotropic conductive film disposed between the flexible film and the plurality of side electrodes,
wherein each of the plurality of side electrodes is electrically connected through the anisotropic conductive film to a corresponding one of the plurality of lead electrodes.

11. The display device of claim 1, wherein each of the plurality of side electrodes is directly bonded to a corresponding one of the plurality of lead electrodes.

12. A display device, comprising: a display panel which includes a display area and a non-display area surrounding the display area, the display panel including a plurality of driving lines disposed in the non-display area, a plurality of driving pads connected to the plurality of driving lines, and a floating pad disposed between adjacent driving pads, the floating pad being in a floating state; a plurality of side electrodes on a side surface of the display panel and in contact with side surfaces of the plurality of driving pads; and a flexible film that includes a plurality of lead electrodes in contact with the plurality of side electrodes, wherein the plurality of driving pads include a first driving pad, a second driving pad and a third driving pad sequentially arranged in a first direction, wherein the first driving pad receives a first control signal having a first potential, the second driving pad receives a second control signal having a second potential, the third driving pad receives a third control signal having a third potential, and a potential difference between the first control signal and the second control signal is different from a potential difference between the second control signal and the third control signal.

13. The display device of claim 12, wherein
the potential difference between the first control signal and the second control signal is less than a reference value,
the floating pad is not disposed between the first driving pad and the second driving pad,
the potential difference between the second control signal and the third control signal is greater than the reference value, and
the floating pad is disposed between the second driving pad and the third driving pad.

14. The display device of claim 13, wherein the reference value is equal to or greater than about 7 V.

15. The display device of claim 13, wherein
the first driving pad and the second driving pad are spaced apart at a first interval, and
the second driving pad and the third driving pad are spaced apart at a second interval greater than the first interval.

16. The display device of claim 15, wherein the plurality of side electrodes include:
a first side electrode in contact with a side surface of the first driving pad;
a second side electrode in contact with a side surface of the second driving pad; and
a third side electrode in contact with a side surface of the third driving pad,
wherein the first side electrode and the second side electrode are spaced apart at the first interval, and
wherein the second side electrode and the third side electrode are spaced apart at the second interval greater than the first interval.

17. The display device of claim 16, wherein
the plurality of side electrodes include silver (Ag), and
the plurality of driving pads include copper (Cu).

18. The display device of claim 12, further comprising an anisotropic conductive film disposed between the flexible film and the plurality of side electrodes,
wherein each of the plurality of side electrodes is electrically connected through the anisotropic conductive film to a corresponding one of the plurality of lead electrodes.

* * * * *